(12) United States Patent
Maier

(10) Patent No.: US 11,652,021 B2
(45) Date of Patent: May 16, 2023

(54) POWER MODULE HAVING PACKAGED POWER SEMICONDUCTORS FOR THE CONTROLLABLE SUPPLY OF ELECTRIC POWER TO A LOAD

(71) Applicant: ZF Friedrichshafen AG, Friedrichshafen (DE)

(72) Inventor: Thomas Maier, Neunburg v. Wald (DE)

(73) Assignee: ZF FRIEDRICHSHAFEN AG, Friedrichshafen (DE)

(*) Notice: Subject to any disclaimer, the term of this patent is extended or adjusted under 35 U.S.C. 154(b) by 394 days.

(21) Appl. No.: 16/868,333

(22) Filed: May 6, 2020

(65) Prior Publication Data
US 2020/0357717 A1    Nov. 12, 2020

(30) Foreign Application Priority Data
May 7, 2019  (DE) ..................... 10 2019 206 523.6

(51) Int. Cl.
*H01L 23/367* (2006.01)
*H01L 25/11* (2006.01)
(Continued)

(52) U.S. Cl.
CPC ...... *H01L 23/3675* (2013.01); *H01L 23/3121* (2013.01); *H01L 23/5386* (2013.01);
(Continued)

(58) Field of Classification Search
CPC ............. H01L 23/3675; H01L 23/5386; H01L 25/115; H01L 23/145; H01L 23/31;
(Continued)

(56) References Cited

U.S. PATENT DOCUMENTS 6,081,027 A * 6/2000 Akram ................ H01L 23/4951
257/E23.092
6,195,256 B1 * 2/2001 Tiziani .................. H05K 3/341
361/705
(Continued)

FOREIGN PATENT DOCUMENTS

DE    10 2007 014 789 B3    11/2008
DE        101 96 942 B4       3/2009
(Continued)

OTHER PUBLICATIONS

Search Report issued in German Patent Application No. DE 10 2019 206 523.6 dated Apr. 7, 2020 (22 pages).

*Primary Examiner* — Eduardo A Rodela
(74) *Attorney, Agent, or Firm* — Crowell & Moring LLP

(57) ABSTRACT

A power module has a plurality of packaged power semiconductors, a printed circuit board, a heat sink, and possibly a sealing compound. The power semiconductors have electrically conductive connection elements and heat removal areas on respective outer sides. The power semiconductors are arranged on a cooling surface of the heat sink and has its heat removal area connected to the cooling surface of the heat sink to conduct heat, and the printed circuit board is arranged on a side of the power semiconductors that is opposite the heat sink in an orthogonal direction, wherein the connection elements of the power semiconductors make electrical contact with pads on the printed circuit board regions, for example, laterally beside an edge of the heat sink, in which a projection of the heat sink onto the printed circuit board in the orthogonal direction does not cover the connection elements.

15 Claims, 3 Drawing Sheets

(51) Int. Cl.
    *H01L 23/538*     (2006.01)
    *H01L 23/31*     (2006.01)
    *H01L 25/16*     (2023.01)
    *H05K 1/18*     (2006.01)

(52) U.S. Cl.
    CPC ............ *H01L 25/115* (2013.01); *H01L 25/16* (2013.01); *H05K 1/181* (2013.01); *H05K 2201/066* (2013.01); *H05K 2201/10015* (2013.01)

(58) Field of Classification Search
    CPC ............ H01L 23/3121; H01L 23/3672; H01L 23/3736; H01L 23/49537; H01L 23/49568; H01L 23/49589; H01L 23/49861; H01L 25/065; H01L 25/0652; H01L 25/0655; H01L 25/07; H01L 25/071; H01L 25/072; H01L 25/16; H02K 11/33; H02K 2211/03; H05K 1/181; H05K 7/209; H05K 2201/066
    See application file for complete search history.

(56) References Cited

U.S. PATENT DOCUMENTS

| | | | |
|---|---|---|---|
| 10,991,650 B2* | 4/2021 | Nishizawa | H01L 23/50 |
| 11,322,432 B2* | 5/2022 | Sugimachi | H01L 23/49548 |
| 2004/0232545 A1* | 11/2004 | Takaishi | H01L 23/49537 257/E23.092 |
| 2005/0087854 A1* | 4/2005 | Choi | H01L 23/49816 257/712 |
| 2005/0135065 A1 | 6/2005 | Nakatsu et al. | |
| 2006/0018100 A1 | 1/2006 | Guo | |
| 2006/0019518 A1* | 1/2006 | Lam | H01R 12/7076 439/119 |
| 2006/0151861 A1* | 7/2006 | Noquil | H01L 23/488 257/E23.101 |
| 2007/0227027 A1 | 10/2007 | Holzapfel et al. | |
| 2014/0264799 A1* | 9/2014 | Gowda | H01L 23/49568 438/122 |
| 2015/0028462 A1* | 1/2015 | Hasegawa | H01L 23/4952 257/675 |
| 2017/0271229 A1* | 9/2017 | Santos | H01L 23/3135 |
| 2019/0080980 A1* | 3/2019 | Otremba | H01L 23/4334 |
| 2019/0189553 A1* | 6/2019 | Hohlfeld | H01L 23/49551 |

FOREIGN PATENT DOCUMENTS

| | | |
|---|---|---|
| DE | 101 49 093 B4 | 5/2009 |
| DE | 10 2013 212 446 A1 | 1/2015 |
| EP | 2 458 632 A1 | 5/2012 |
| JP | 2002-198477 A | 7/2002 |
| WO | WO 02/099878 A1 | 12/2002 |

\* cited by examiner

POWER MODULE HAVING PACKAGED POWER SEMICONDUCTORS FOR THE CONTROLLABLE SUPPLY OF ELECTRIC POWER TO A LOAD

CROSS-REFERENCE TO RELATED APPLICATIONS

This application claims priority from German Application No. 10 2019 206 523.6, filed on May 7, 2019, the entirety of which is each hereby fully incorporated by reference herein.

The invention relates to a power module having packaged power semiconductors for the controllable supply of electric power to a load.

Power modules are used to supply loads, such as for example electric motors, with an electric power required for the operation thereof in a controllable manner. Such power modules are sometimes also referred to as inverters or converters.

By way of example, power modules can be used to make electric power available from a battery to an electric motor serving as drive in a vehicle in regulated fashion. The controllable power supply can range from a few kilowatts to several 100 kW.

To this end, the power modules normally have power semiconductor devices (referred to below as "power semiconductors" for short), for example in the form of IGBTs (insulated-gate bipolar transistor), SiCs (power modules with silicon carbide MOSFETs) or power MOSFETS, which are controlled by an actuating circuit.

Conventional power modules involve IGBTs or SiC chips being put, i.e. for example soldered or sintered, onto what is known as a DCB (direct copper bonded), that is to say a structure that allows close electrical and thermal connection of electronic subassemblies and chips by means of copper. The DCB can then be sintered or soldered onto a copper plate having a cooling structure, for example. The whole thing can then be overmoulded to render it media-impermeable.

Alternatively, conventional power modules involve IGBT subassemblies being mounted on a heat sink by using what is known as a thermal interface material such as for example a film or a thermally conductive paste. Alternatively, an electrically insulated package of such subassemblies can be soldered or sintered onto the heat sink directly. An electrical connection is made in this case for example by welding onto a stamped grid or by virtue of the subassemblies being soldered to a printed circuit board by using a through-hole technique.

Conventional power modules often have a relatively complex design and are therefore complicated to manufacture. Additionally, power modules are for the most part designed for a specific application, and their design cannot easily be matched or scaled to requirements of other applications as a rule. Power modules that are easier to manufacture and/or matchable on an application-specific basis often require a large installation space and/or relatively expensive subassemblies.

An object of the present invention can therefore be considered that of providing a power module that overcomes at least some of the shortcomings of conventional power modules mentioned above. In particular, there can be a need for a power module that is designed simply and using inexpensive components, can be manufactured with little effort and/or requires little installation space.

Such an object can be achieved by the subject matter disclosed herein. Further embodiments of the invention result from the description below.

One aspect of the invention relates to a power module for the controllable supply of electric power to a load. The power module has a plurality of packaged power semiconductors, a printed circuit board and a heat sink. The packaged power semiconductors have electrically conductive connection elements and furthermore have a heat removal area on a respective outer side. The power module is distinguished in that each of the packaged power semiconductors is arranged on a cooling surface of the heat sink and has its heat removal area connected to the cooling surface of the heat sink so as to be able to conduct heat, and in that the printed circuit board is arranged on a side of the power semiconductors that is opposite the heat sink in an orthogonal direction, wherein the connection elements of the power semiconductors make electrical contact with pads on the printed circuit board in regions in which a projection of the heat sink onto the printed circuit board in the orthogonal direction does not cover the connection elements.

Embodiments of the power module described herein differ from conventional power modules more particularly in respect of an overall design concept of the power module using discrete components.

To control the electric power made available by the power module, packaged power semiconductors are used in this instance, i.e. components in which power semiconductor subassemblies such as for example IGBTs, SiCs or power MOSFETs are surrounded by a package made from plastic, for example. The packaged power semiconductors have elongate, electrically conductive connection elements, for example in the form of metal legs that protrude from the plastic package surrounding a power semiconductor to the outside. These connection elements can be used to supply the semiconductor devices integrated in the packaged power semiconductor with control signals and/or electric power. Such packaged power semiconductors therefore differ from packageless "bare dies". Packaged power semiconductors are robust and can be manufactured, stored and ultimately processed as standard subassemblies in large numbers and therefore cheaply.

Since power semiconductors always involve some of the conducted electric power leading to heating of the power semiconductors in the form of losses, the packaged power semiconductors have a heat removal area on an outer side. Such a heat removal area is sometimes also referred to as an "exposed pad". The heat removal area can be in the form of a layer or plate that is made from a readily thermally conductive material such as for example a metal, in particular copper, and integrated in the packaged power semiconductor and exposed on one surface.

In order to be able to control a response of the power semiconductors, there is provision for an actuating circuit. This actuating circuit can be designed using electrical or electronic devices. These devices can be held on a printed circuit board and electrically connected to one another and/or to connections via the latter. The printed circuit board can be the printed circuit board that is integrated in the power module proposed herein. This printed circuit board can also be used, among other things, to supply power to the power semiconductors, i.e. be designed to be able to conduct several 100 A. By way of example, this printed circuit board can be in the form of a thick copper printed circuit board, a copper layer being able to have thicknesses of 100 µm or more. Alternatively, the subassemblies can be fitted to a separate printed circuit board.

In order to be able to dissipate heat from the power semiconductors, the power module has a heat sink. This heat sink can be a metal plate, in particular a copper plate, for example. If appropriate, the heat sink can have an integrated cooling structure such as for example cooling ribs. The heat sink can be cooled passively, for example by radiation exchange and/or heat exchange with a surrounding medium. Alternatively, the heat sink can be cooled actively, for example by a cooling medium flowing through it.

The overall design concept described here for a power module involves each of the packaged power semiconductors being thermally connected to a cooling surface of the heat sink. To this end, the heat removal area of the power semiconductor makes contact with the cooling surface of the heat sink in a readily thermally conductive manner. By way of example, the preferably metallic heat removal area can be soldered, welded or sintered onto the likewise preferably metallic cooling surface. As extensive a contact as possible and hence a thermally conductive connection over a large area can be sought in this case.

The printed circuit board of the power module in the concept proposed here is arranged on a side of the power semiconductors that is opposite in the orthogonal direction from the side on which the heat sink is arranged. Put another way, the heat sink can be arranged below the power semiconductors, for example, whereas the printed circuit board is then arranged above the power semiconductors. The printed circuit board can cover the whole region in which the power semiconductors of the power module are arranged, or can even go beyond this region laterally, i.e. transversely with respect to the orthogonal direction.

The connection elements of the power semiconductors are then supposed to make electrical contact with the printed circuit board, in order to be able to use it to receive electrical signals and/or electric power, for example. To this end, there is provision on the printed circuit board, preferably on the surface directed toward the power semiconductors, for pads that are electrically conductive and are made from metal, for example.

A characteristic of the power module proposed herein is that these pads are provided in regions of the printed circuit board, and have contact made with them there by the connection elements, in which a projection of the heat sink onto the printed circuit board in the orthogonal direction does not cover the connection elements. Put another way, the heat sink is not supposed to cover the printed circuit board where the power semiconductors have their connection elements electrically connected to the pads of the printed circuit board, which means that the pads and the connection elements are freely accessible on the side of the printed circuit board that faces the heat sink. Accordingly, the connection elements can be electrically connected to the pads in a simple manner during manufacture of the power module, for example by being soldered to the pads.

The proposed overall design concept allows simple manufacture of the power module, efficient cooling of the components thereof, in particular of the packaged power semiconductors, and an opportunity to be able to match a design of the power module to requirements of different applications in a relatively simple manner by using standard semiconductor devices.

According to one embodiment, the connection elements can make electrical contact with the pads on the printed circuit board in a manner running parallel to the pads. Put another way, the connection elements, at least at the point at which they make contact with the pads on the printed circuit board, are supposed to run parallel to said pads. Preferably, the connection elements exit the package of the packaged power semiconductors in a direction that runs parallel to the pads.

Conventional design concepts for power modules involve the connection elements running for the most part orthogonally with respect to a printed circuit board of the actuating circuit. During the assembly of conventional power modules of this kind, such connection elements then need to be electrically connected to electrically conductive structures on the printed circuit board. To this end, the connection elements are for the most part introduced into through-holes in the printed circuit board, and for example soldered there, using what is known as through-hole technology. However, fitting the connection elements into the through-holes can be complicated and/or prone to error, in particular if very many connection elements need to be connected to the printed circuit board.

In the embodiment described, the connection elements are therefore supposed to run not orthogonally but rather parallel to the printed circuit board. Such a configuration allows the connection elements to be connected to electrically conductive structures on the printed circuit board in a simple and reliable manner. In particular, it is possible to dispense with complicated fitting of connection elements into through-holes in the printed circuit board.

By way of example, the connection elements can be electrically connected to pads on the side of the printed circuit board that faces the heat sink. The connection elements running parallel to the printed circuit board can be attached to the pads of the printed circuit board and then electrically connected to them, for example by soldering or welding. In particular, this can be accomplished by using a method referred to as split head soldering, which involves the connection elements being pressed onto the pads and then an electric current being passed through, the heat of which is used to melt a solder.

According to one embodiment, the connection elements make electrical contact with the pads on the printed circuit board in a manner laterally beside an edge of the heat sink.

Put another way, the heat sink can be in a geometric form, and dimensioned, such that its lateral edge does not cover the pads on the printed circuit board, and these are therefore exposed. Beside this edge of the heat sink, the connection elements can therefore easily have mechanical contact made with them from the side facing the heat sink during the manufacturing process, and for example can be pushed against the pad on the printed circuit board in order to electrically connect them thereto, for example by soldering or sintering. Electrical connection of the connection elements to the pads can therefore be performed particularly easily.

Alternatively, according to one embodiment, the heat sink can have continuous openings and the connection elements can make electrical contact with the pads on the printed circuit board in a manner bordering the openings in the heat sink in regions in the orthogonal direction.

In other words, the heat sink can admittedly be in a geometric form, and dimensioned, such that the heat sink, if it were continuous, would cover the pads on the printed circuit board. However, in such a configuration, there could be provision for openings in the heat sink that extend through the heat sink at positions that border the pads on the printed circuit board in the orthogonal direction. The pads on the printed circuit board can therefore again be exposed in the region of these openings, and, during manufacture of the power module, the connection elements can be easily accessible in these regions from the side facing the heat sink, in order to be able to electrically connect them to the pads.

According to one embodiment, the power module can furthermore have a sealing compound that covers both the packaged power semiconductors and at least subregions of the printed circuit board with respect to the surroundings.

Depending on conditions of use, it may be necessary to encapsulate components of the power module with respect to the surroundings in order for example to protect them from contact with surrounding fluid media or soiling such as e.g. metal shavings. By way of example, liquids such as for example water should be prevented from coming into contact with components of the power module, for example in order to avoid electrical shorts and/or corrosion. In particular in the case of applications in which a power module is supposed to be used within very aggressive media such as for example inside a gearbox flooded with aggressive oil, the components of the power module should be packed or encapsulated in sealed fashion.

For this purpose, the power module can have a sealing compound that covers both the packaged power semiconductors and at least subregions of the printed circuit board with respect to the surroundings. The sealing compound can consist for example of a material that can be processed in liquid or viscous form and can subsequently be cured. By way of example, the sealing compound can be produced with a plastic, in particular a thermosetting plastic, a thermoplastic, a polymer and/or an elastomer. The sealing compound can be processed by injection moulding, moulding, casting or other processes, for example.

According to one embodiment, the printed circuit board is arranged at a distance from the packaged power semiconductors in the orthogonal direction.

In other words, there can be a gap between a surface of the packaged power semiconductors that faces the printed circuit board and a surface of the printed circuit board that faces the power semiconductors, so that the power semiconductors are not directly adjacent to the printed circuit board. The gap can have a thickness of between 0.05 mm and 5 mm, preferably between 0.1 mm and 2 mm, for example. As a result of the power semiconductors not being directly adjacent to the printed circuit board, it is possible to avoid cracks or delaminations in the sealing compound, in particular if both components are encapsulated in the sealing compound together. Such cracks or delaminations can otherwise arise in particular as a result of the plastic of the sealing compound significantly shrinking, and mechanical stresses therefore building up therein, after components are extrusion-coated, for example.

According to one embodiment, the heat sink is fashioned such, and the printed circuit board is arranged such, that subregions of the heat sink are directly adjacent to a surface of the printed circuit board.

Put another way, the heat sink does not necessarily have to be flat on its surface directed toward the printed circuit board, but rather can have protrusions, for example, by means of which it can make mechanical contact with the printed circuit board. At the point at which the heat sink is directly adjacent to the surface of the printed circuit board, good thermally conductive contact between the two components can be produced. Accordingly, heat that can be generated in the printed circuit board, for example on account of high electric currents conducted by the latter and losses arising in the process, can be efficiently dissipated from the printed circuit board to the heat sink.

Alternatively, according to one embodiment, the power module can furthermore have a thermally conductive layer on a surface of the printed circuit board, and the heat sink can be designed such, and the printed circuit board can be arranged such, that subregions of the heat sink are adjacent to a surface of the thermally conductive layer that is opposite the printed circuit board.

In other words, the heat sink can have protrusions on its surface directed to the printed circuit board, similarly to the previous embodiment. However, the protrusions of the heat sink are not directly adjacent to the surface of the printed circuit board in this case. Instead, there is a thermally conductive layer on the surface of the printed circuit board, that is to say between the printed circuit board and the protrusions of the heat sink. This thermally conductive layer can have a higher thermal conductivity than the sealing compound. The thermally conductive layer can therefore ensure efficient heat transfer between the printed circuit board and the heat sink. The thermally conductive layer can ensure a certain level of mechanical compensation during a plastic shrinkage process in which the sealing compound loses volume after it is processed, for example, and can thereby prevent crack formation or delaminations if appropriate.

According to one embodiment, the packaged power semiconductors are in a form such that a supply of electric power for each of the power semiconductors is provided exclusively via the connection elements.

Put another way, the electric power to be controlled by the packaged power semiconductor is preferably supposed to be conducted exclusively by the connection elements of the packaged power semiconductor. Since the connection elements run on the regions of the printed circuit board that are not covered by the heat sink, and are therefore easily accessible from outside, these connection elements can be connected to pads of the printed circuit board in a simple manner during manufacture of the power module.

By contrast, there are packaged power semiconductors in which a heat removal area produced using metal is simultaneously used as an electrical connection. The metallic heat sink to which the heat removal area is adjacent can then also be used as an electrical connection. The heat removal area is normally not easily accessible from outside in this case, however, which means that electrical connection to the heat sink can be complicated.

According to one embodiment, the packaged power semiconductors and/or the connection of the packaged power semiconductors to the heat sink can be fashioned such that electrically conductive power-controlling structures inside the packaged power semiconductors are electrically insulated from the heat sink.

In other words, for example the power-controlling IGBT, SiC or power MOSFET in a packaged power semiconductor, including all of its connections, can be electrically insulated from the heat removal area of the packaged power semiconductor, so that even if the heat removal area is electrically conductively adjacent to the heat sink, there is no electrical connection between these power-controlling structures and the heat sink. Alternatively or additionally, there can be provision for an electrically insulating layer between the heat removal area of the packaged power semiconductor and the cooling surface of the heat sink.

The heat sink can be in a simple form in this case, for example in the form of a continuous metallic structure, in particular in the form of a metal plate. In this instance, the heat sink can be used as a heat sink for multiple packaged power semiconductors and can be in admittedly thermal but not necessarily electrical contact with these power semiconductors. A structural configuration of the power module can therefore be relatively simple, since the heat sink does not need to be equipped as a complex device for making electrically separate contact with various power semiconductors.

According to one embodiment, the power module can furthermore have a DC-link capacitor.

Put another way, a DC-link capacitor, which can ensure energy coupling of multiple electrical systems to one another at a common DC level, can be integrated in the power module. This allows a functionality of the power module to be improved and/or a design of the overall power module to be simplified. The DC-link capacitor can be fashioned as a film capacitor having one or more capacitor elements.

In particular, the DC-link capacitor can be arranged in a manner adjoining a side of the printed circuit board that is remote from the heat sink.

In other words, the DC-link capacitor can be arranged above the printed circuit board that is over the heat sink, and can therefore be in direct proximity to the packaged power semiconductors. This allows a very low-induction design to be realized. This in turn can allow very fast switching of the power semiconductors.

Further, the DC-link capacitor can be electrically connected to the printed circuit board.

Put another way, the DC-link capacitor can be connected to electrical connections of the printed circuit board, for example, in an easily realizable manner, for example by soldering, welding, adhesive bonding or similar techniques.

Additionally, at least part of the DC-link capacitor can be embedded in the sealing compound, which also covers the power semiconductors and subregions of the printed circuit board.

In particular, it can be advantageous to fashion the sealing compound, or to put it on during manufacture of the power module, such that it covers the entire DC-link capacitor and the packaged power semiconductors and at least part of the printed circuit board and hence encapsulates them against soiling and/or to render them media-impermeable. In this instance, it can suffice during manufacture of the power module to subject a previously formed unit comprising heat sink, printed circuit board and power semiconductors, together with the DC-link capacitor, to a joint moulding process in which all the subassemblies mentioned are extrusion-coated with the sealing compound.

Exemplary embodiments of the invention are described in detail below with reference to the accompanying figures.

The reference signs used in the figures and their meanings are listed in summary form in the list of reference signs. In principle, identical or similar parts are provided with the same reference signs. The figures are merely schematic and not to scale.

Figure 1:
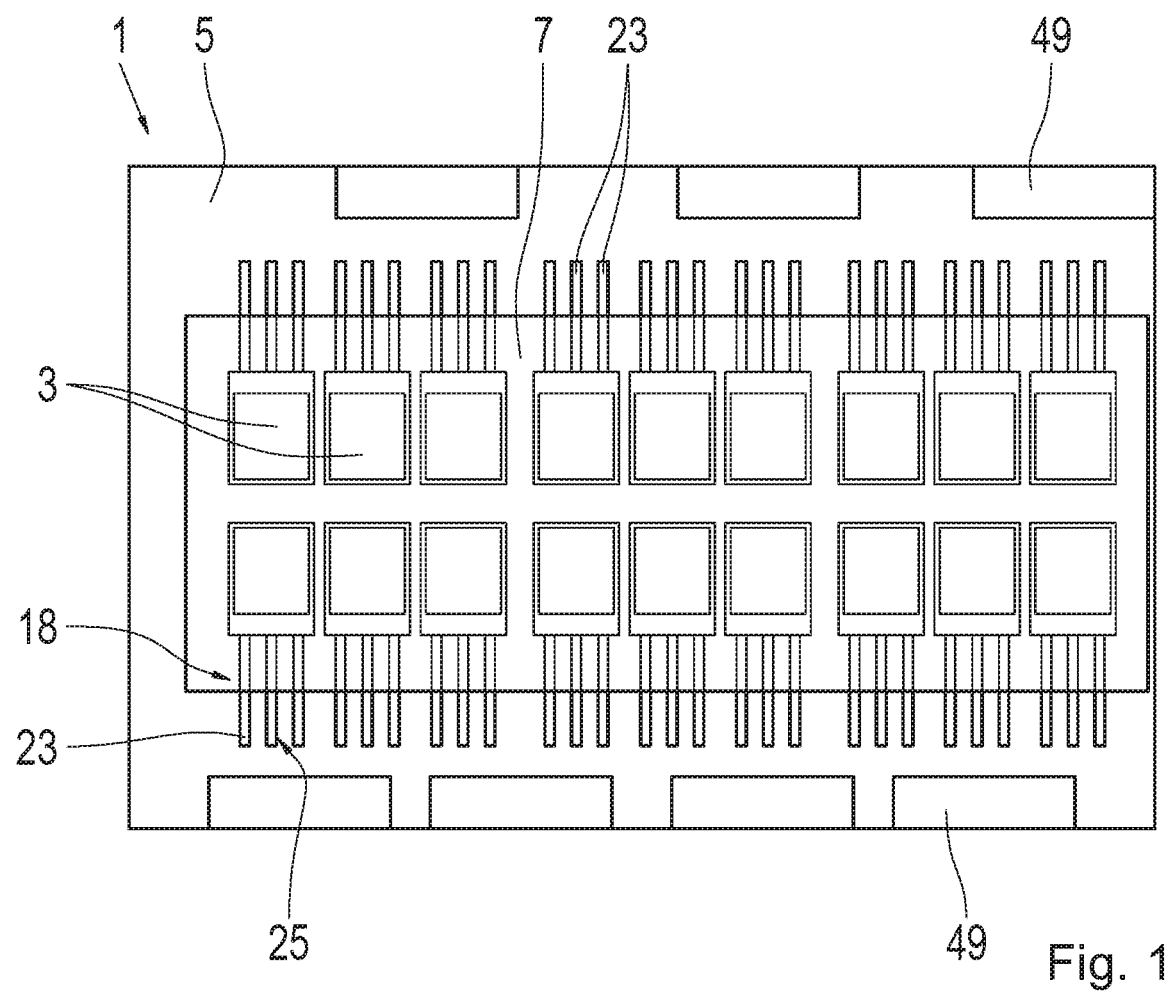
FIG. 1 shows a plan view from below of a respective power module according to an embodiment of the present invention.
Figure 2:
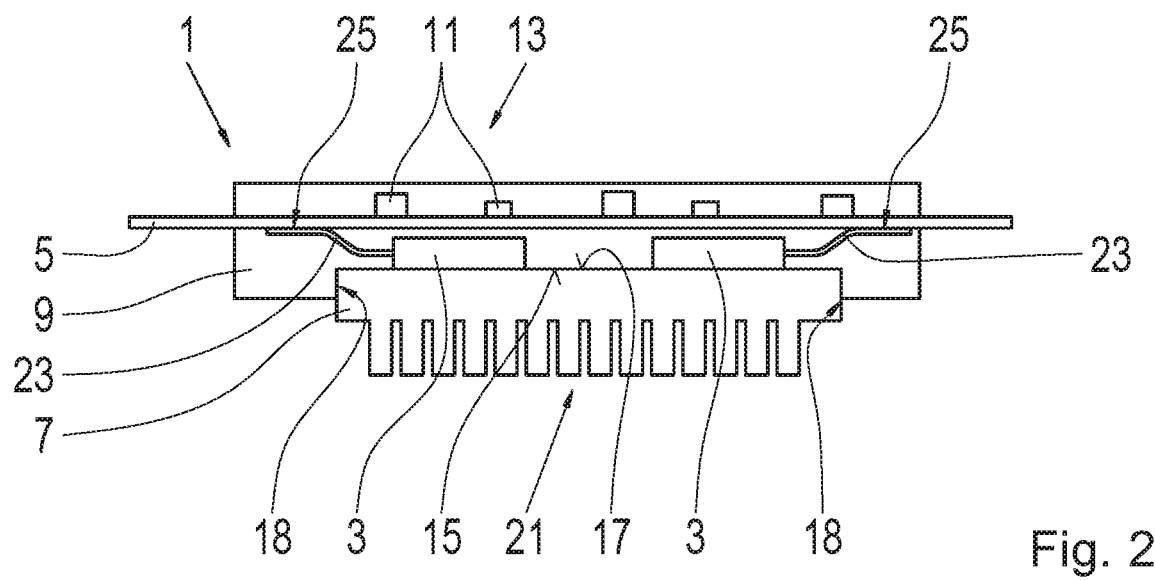
FIG. 2 shows a sectional view through power modules according to various embodiments of the present invention.
Figure 3:
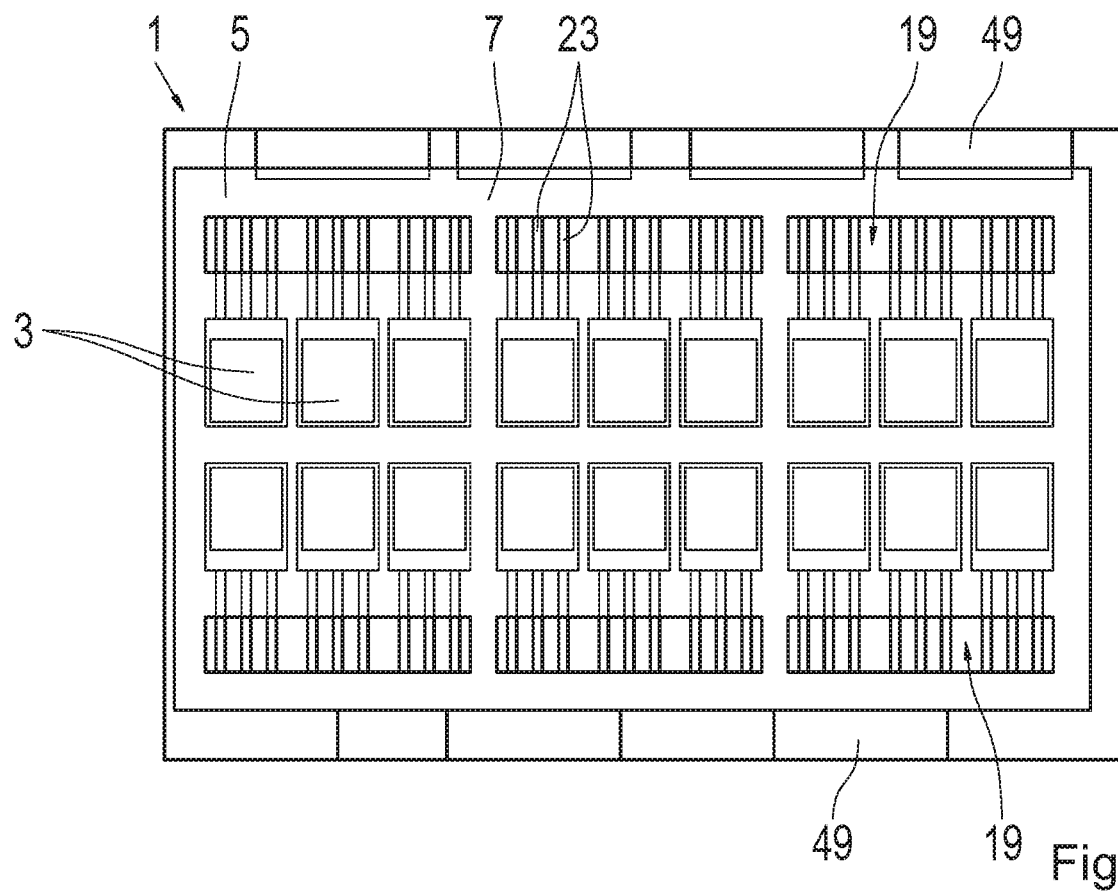
FIG. 3 shows another plan view from below of a respective power module according to an embodiment of the present invention.
Figure 4:
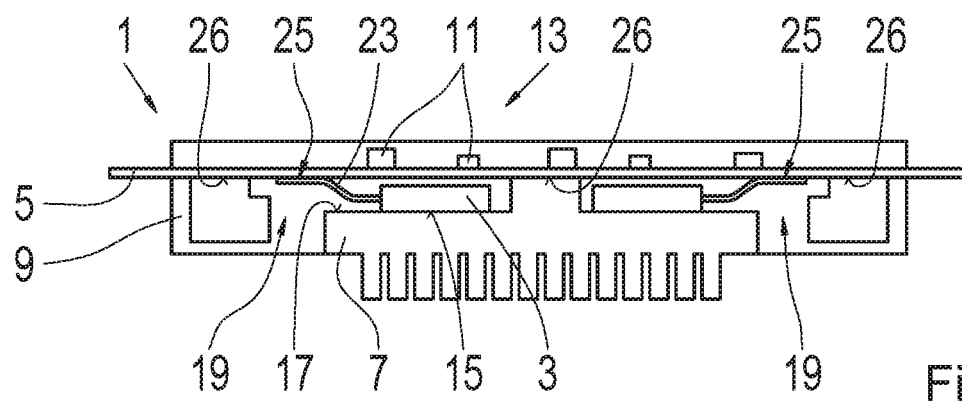
FIG. 4 shows another sectional view through power modules according to various embodiments of the present invention.
Figure 5:
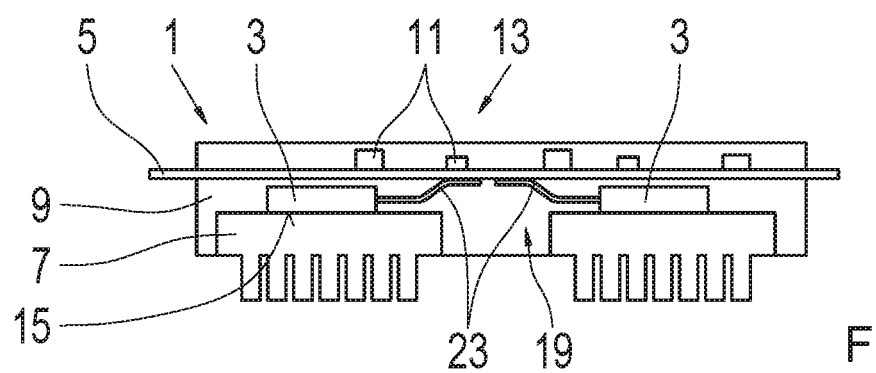
FIG. 5 shows another sectional view through power modules according to various embodiments of the present invention.

FIGS. 1 and 3 each show a plan view of a power module 1 for the controllable supply of electric power to a load (not depicted) such as for example an electric motor in an electrically driven vehicle. FIG. 2 shows a sectional view through the power module 1 from FIG. 1. FIG. 4 shows a sectional view through the power module 1 from FIG. 3. FIG. 5 shows a slightly modified variant of the power module 1 from FIG. 4.

The power module 1 comprises multiple packaged power semiconductors 3, a printed circuit board 5, a heat sink 7 and a sealing compound 9. The heat sink 7 can be in the form of a cooling plate made from a metal such as for example copper and, if appropriate, can have cooling structures 21. There is provision on the printed circuit board 5 for electrical and/or electronic devices 11 that form an actuating circuit 13 for actuating the power semiconductors 3. Electric power can be supplied for example by a battery via external connections 49 and then delivered via other external connections 49 for example to motor phases of an electric motor under the control of the power module 1.

Each of the power semiconductors 3 has a heat removal area 15 on its outer side directed toward the heat sink 7. There is provision on this heat removal area 15 on the packaged power semiconductor 3 for a metallic area or plate by means of which heat produced inside the packaged power semiconductor 3, for example by a power-controlling semiconductor device therein, such as an IGBT, an SiC or a power MOSFET, can be dissipated.

The packaged power semiconductors 3 each have electrically conductive connection elements 23. In the example depicted, there is provision for three respective connection elements 23 on each power semiconductor 3, but it is also possible for more than three connection elements 23 to exist. The connection elements 23 are used to electrically connect power-controlling structures for example in the form of semiconductor devices inside the packaged power semiconductors 3, in order to supply the latter with control signals and/or the electric power to be controlled.

Each of the packaged power semiconductors 3 is arranged on a cooling surface 17 of the heat sink 7. The heat removal area 15 of the packaged power semiconductor 3 is connected to the cooling surface 17 of the heat sink 7 in thermally conductive fashion.

The printed circuit board 5 is arranged on a side of the power semiconductors 3 that is opposite the side on which the heat sink 7 is arranged in an orthogonal direction. Put another way, the power semiconductors 3 are situated between the heat sink 7 and the printed circuit board 5.

The heat sink 7 is fashioned such, and the connection elements 23 of the power semiconductors 3 are arranged such, that the connection elements 23 make electrical contact with pads 25 on the printed circuit board 5 in regions in which a projection of the heat sink 7 onto the printed circuit board 5 in the orthogonal direction does not cover the connection elements 23.

In the embodiment depicted in FIGS. 1 and 2, this is accomplished by virtue of the elongate connection elements 23 being arranged laterally beside an edge 18 of the heat sink 7 and making contact with the pads 25 there.

In the embodiment depicted in FIGS. 3 and 4, there is provision in the heat sink 7 for continuous openings 19. The openings 19 are situated beside an edge of the heat sink 7. The connection elements 23 in this case make contact with the pads 25 on the printed circuit board 5 in regions that border the openings 19 in the heat sink 7 in the orthogonal direction, i.e. at points at which the heat sink 7, on account of the openings 19 provided therein, does not cover the printed circuit board 5.

In the embodiment depicted in FIG. 5, there is provision for one central elongate opening 19 instead of the two elongate openings 19 provided close to the edge of the heat sink 7 in the embodiment described above.

In the cited embodiments of FIGS. 1 to 5, the heat sink 7 does not cover the connection elements 23, embodied as legs, of the power semiconductors 3 in a manner locally bordering the pads 25 and thus allows the connection elements 23 to be freely accessible and to be able to be soldered to the pads 25 by split head soldering, for example.

In the embodiments described, the side of the power semiconductors 3 that is directed toward the printed circuit board 5 can make direct contact with the printed circuit board 5 or alternatively be at a distance therefrom via a gap.

In the embodiment depicted in FIG. 4, the heat sink 7 is fashioned such, and the printed circuit board 5 is arranged such, that protruding subregions 26 of the heat sink 7 are directly adjacent to a surface of the printed circuit board 5. In this way, the printed circuit board 5 can efficiently dissipate heat to the heat sink 7.

The sealing compound 9 covers both the packaged power semiconductors 3 and a subregion of the printed circuit board 5. The moulded sealing compound 9, for example formed by a thermoset, encapsulates the cited components preferably to render them fluid-impermeable.

The power module 1 can be manufactured for example by fitting the printed circuit board 5 with the devices 11, so that these are electrically interconnected to form the actuating circuit by means of SMD soldering. In this way, a first assembly can be formed. Separately therefrom, a second assembly can be formed by virtue of the power semiconductors 3 being soldered, sintered or adhesively bonded, for example, to the heat sink 7. Subsequently, the two assemblies can be connected to one another by soldering the connection elements 23 of the power semiconductors 3 to the pads 25 on the printed circuit board 5 by split head soldering, for example. Finally, the whole assembly formed in this manner can be overmoulded or encapsulated with the sealing compound 9.

Figure 6:
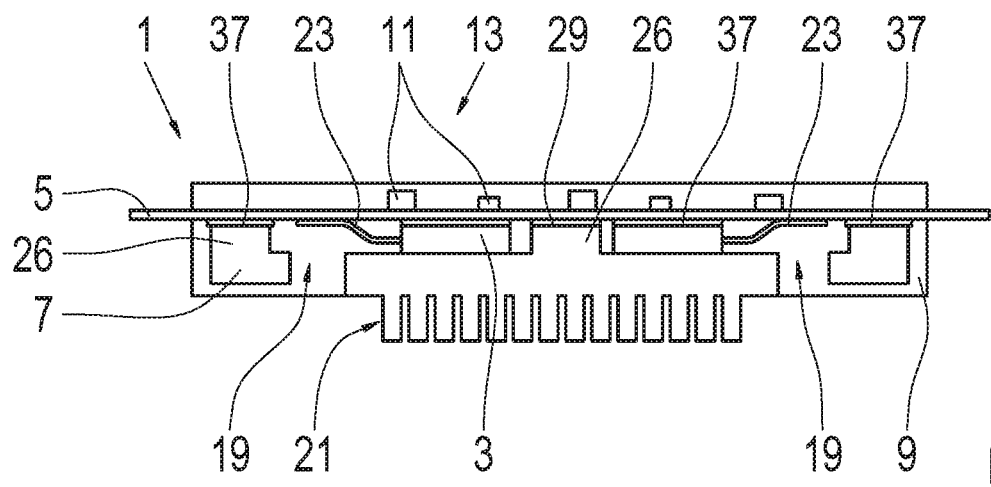
FIG. 6 shows another sectional view through power modules according to various embodiments of the present invention.

In the embodiment depicted in FIG. 6, there is provision on a surface of the printed circuit board 5 that is directed toward the heat sink 7 for a thermally conductive layer 37. The heat sink 7 is fashioned such that it is adjacent to this thermally conductive layer 37 in a protruding subregion 26. Accordingly, heat can be dissipated from the printed circuit board 5 to the heat sink 7 efficiently. The thermally conductive layer 37 can be used as a compensating element in order to prevent formation of cracks or delaminations during a shrinkage process of the sealing compound 9. The thermally conductive layer 37 can also extend between the power semiconductors 3 and the printed circuit board 5, and this region might alternatively also be filled with the sealing compound 9.

Figure 7:
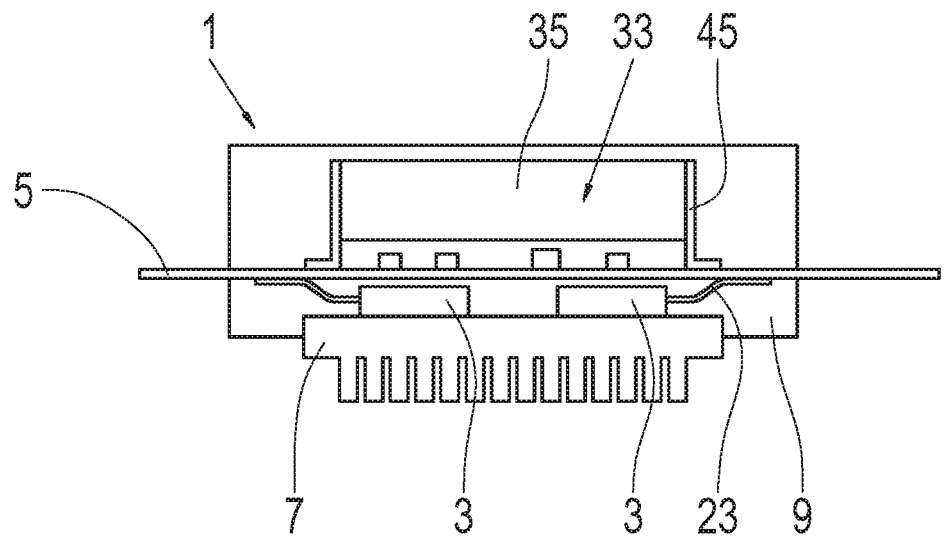
FIG. 7 shows another sectional view through power modules according to various embodiments of the present invention.

FIG. 7 depicts an embodiment of the power module 1 that additionally has a DC-link capacitor 33. The DC-link capacitor 33 can have one or more capacitor elements 35. The DC-link capacitor 33 is arranged in a manner adjoining a side of the printed circuit board 5 that is remote from the heat sink 7, and is electrically connected to the printed circuit board 5 via capacitor connections 45. In order to protect the DC-link capacitor 33, part or all of it is embedded in the sealing compound 9, which also covers the power semiconductors 3 and subregions of the printed circuit board 5.

Figure 8:
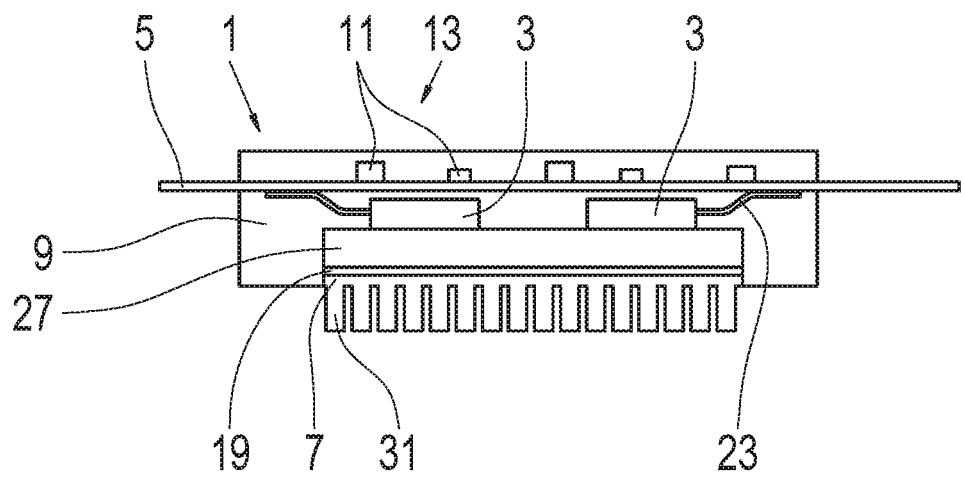
FIG. 8 shows another sectional view through power modules according to various embodiments of the present invention.

FIG. 8 illustrates an alternative embodiment of the power module 1. The heat sink 7 in this instance is of two-part design and has an upper cooling plate 27, which is separated from a lower cooling structure 31 by an interposed electrically insulating layer 29. The electrically insulating layer 29 can be a thermally conductive film.

In such a configuration, the heat sink 7 and in particular the upper cooling plate 27 thereof can be used as a busbar. Such a busbar can be used to supply the power semiconductors 3 with electric power. In such a configuration, the heat removal area 15 connected to the heat sink 7 is preferably electrically connected to connections of the power-controlling structures inside the power semiconductors 3. That is to say that for example an electrical connection of an IGBT or of an SiC can be electrically connected to the metallic heat removal area 15.

In conclusion, possible configurations and details of embodiments of the power module presented herein are explained in summary and using a slightly different choice of words:

A design of a power module is presented, having packaged power semiconductors (for example IGBTs, SiCs, power MOSFETs, etc.) that have their exposed pad sintered, soldered or adhesively bonded directly to a heat sink, preferably a copper plate with an integrated cooling structure (but this can also be just a metal plate). The exposed pad of the packaged subassembly is preferably electrically insulated (in the subassembly) for this purpose, but it would also be conceivable to insulate the metal plate.

A special feature lies in the overall design concept of the module using discrete components:

The cooling plate, preferably copper, with soldered, sintered or adhesively bonded discrete power semiconductors has a printed circuit board (preferably FR4) placed, screwed or otherwise fastened onto it, said printed circuit board possibly having previously been fitted with the control electronics for the power semiconductors or with other electronics. The connections of the power semiconductors are parallel to the printed circuit board in this arrangement. The connection to the printed circuit board is made not by a through-hole technique but rather preferably by split head soldering or another suitable soldering or welding method, by pushing the connections onto the printed circuit board (used as compensation for tolerances). The heat sink is designed such that it allows free access for the split head soldering of the connection pins to the printed circuit board. Another possible approach is window cutouts in the heat sink, above the connection elements. Current is preferably carried via the integrated printed circuit board in this case.

In order to protect this overall design from rough surroundings (vibration, resistance to media, etc.), it is conceivable to overmould it with plastic or to encapsulate it with a suitable material. A standard package is also conceivable as a solution, however.

Further conceivable embodiments are:
  with window cutout in the heat sink for split head soldering;
  with thermal connection of the printed circuit board (printed circuit board lies directly on top in order to cool fitted subassemblies or the high-current-carrying conductor tracks of the printed circuit board);

connection of the printed circuit board via thermally conductive material, additionally used as compensation for plastic shrinkage process;

additionally, it is also possible to incorporate parts of or the whole DC-link capacitor into the power module. The individual capacitor elements of the film capacitor are preferably arranged directly above the power semiconductors (very low-inductance design, which allows very fast switching) and connected to the printed circuit board (methods such as soldering, welding and adhesive bonding are conceivable in this case) and protected, together with the overall module, from the surroundings and from vibration by overmoulding.

cooling plate is additionally used as busbar. The power semiconductors are not insulated with respect to the exposed pad, or only specific switches.

Embodiments of the presented power module allow the following advantages, among other things, to be achieved simple and robust design and connection concept, which is well-suited to the extrusion-coating technique developed by ZF (in the gearbox field) for packaged devices;

standard components can be connected without through-holes/insertion;

actuating circuits of the power semiconductors can be placed directly on the printed circuit board and are situated very close to the power switches, which assists fast switching;

both assemblies (populated printed circuit board, cooling plate with power switch) can be manufactured independently of one another and connected by means of split head soldering later;

an extrusion-coating process can be used to protect a complete power module, if appropriate including actuation and DC link, to render it media-impermeable;

simple availability of the packaged power switches, as compared with bare-die solutions;

the extrusion-coating technique allows shorter insulation distances for high voltage;

high cost-saving potential as a result of the use of standard power switches in standard packages (good competition);

good scalability of the module in regard to current demand (as a result of parallel connection of the power switches);

high flexibility in terms of installation space;

high added value for in-house manufacture;

the current conduction in the printed circuit board allows a very low-induction design, since the current conduction of the forward and return lines can take place not beside one another but rather slightly above one another in different layers of the printed circuit board. Large current loops are therefore avoided;

additionally, the integration of the DC-link capacitor or parts thereof allows the design to be optimized further in regard to series inductance, which further promotes fast switching.

Additionally, it should be pointed out that "comprising" does not preclude other elements or steps and "a (an)" or "one" does not preclude a plurality. Furthermore, it should be pointed out that features or steps that have been described with reference to one of the above exemplary embodiments can also be used in combination with other features or steps of other exemplary embodiments described above. Reference signs in the claims should not be regarded as restrictions.

REFERENCE NUMBERS 1 power module
3 power semiconductor
5 printed circuit board
7 heat sink
9 sealing compound
11 devices
13 actuating circuit
15 heat removal area
17 cooling surface
18 edge of the heat sink
19 openings
21 cooling structures
23 connection elements
25 pads
26 protruding subregions of the heat sink
27 upper cooling plate
29 electrically insulating layer
31 lower cooling structure
33 DC-link capacitor
35 capacitor element
37 thermally conductive layer
45 capacitor connections
49 external connections

The invention claimed is:

1. A power module for the controllable supply of electric power to a load, wherein the power module comprises:
a plurality of packaged power semiconductors, each comprising a plurality of electrically conductive connection elements and a heat removal area on a respective outer side;
a printed circuit board; and
a heat sink,
wherein each of the packaged power semiconductors is arranged on a cooling surface of the heat sink and has its heat removal area connected to the cooling surface of the heat sink so as to be able to conduct heat, and
wherein the printed circuit board is arranged on a side of the plurality of packaged power semiconductors that is opposite the heat sink in an orthogonal direction, and
wherein all of the plurality of electrically conductive connection elements of the plurality of packaged power semiconductors make electrical contact with pads on the printed circuit board in regions in which a projection of the heat sink onto the printed circuit board in the orthogonal direction does not cover the connection elements.

2. The power module according to claim 1, wherein the plurality of electrically conductive connection elements make electrical contact with the pads on the printed circuit board in a manner running parallel to the pads.

3. The power module according to claim 1, wherein the plurality of electrically conductive connection elements make electrical contact with the pads on the printed circuit board in a manner laterally beside an edge of the heat sink.

4. The power module according to claim 1, wherein the heat sink has continuous openings and the plurality of electrically conductive connection elements make electrical contact with the pads on the printed circuit board in a manner bordering the openings in the heat sink in regions in the orthogonal direction.

5. The power module according to claim 1, further comprising:
a sealing compound that covers the packaged power semiconductors and at least a subregion of the printed circuit board with respect to the surroundings.

6. The power module according to claim 1, wherein the printed circuit board is fitted with devices that form an actuating circuit for actuating the plurality of packaged power semiconductors.

7. The power module according to claim 1, wherein the printed circuit board is arranged at a distance from the packaged power semiconductors in the orthogonal direction.

8. The power module according to claim 1, wherein the heat sink and the printed circuit board are configured such that subregions of the heat sink are directly adjacent to a surface of the printed circuit board.

9. The power module according to claim 1, further comprising:
   a thermally conductive layer on a surface of the printed circuit board,
   wherein the heat sink and the printed circuit board are configured such that subregions of the heat sink are adjacent to a surface of the thermally conductive layer that is opposite the printed circuit board.

10. The power module according to claim 1, wherein the packaged power semiconductors are configured such that a supply of electric power for each packaged power semiconductor is provided exclusively via the plurality of electrically conductive connection elements.

11. The power module according to claim 1, wherein at least one of the packaged power semiconductors or a connection of the packaged power semiconductors to the heat sink are configured such that electrically conductive power-controlling structures inside the packaged power semiconductors are electrically insulated from the heat sink.

12. The power module according claim 1, further comprising:
   a DC-link capacitor.

13. The power module according to claim 12, wherein the DC-link capacitor is arranged adjoining a side of the printed circuit board that is remote from the heat sink.

14. The power module according to claim 12, wherein the DC-link capacitor is electrically connected to the printed circuit board.

15. The power module according to claim 12 at least
   part of the DC-link capacitor is embedded in a sealing compound, wherein the sealing compound also covers the plurality of packaged power semiconductors and at least a subregion of the printed circuit board.

* * * * *